(12) United States Patent
Reime et al.

(10) Patent No.: US 7,280,714 B2
(45) Date of Patent: Oct. 9, 2007

(54) DEVICE AND METHOD FOR OPTOELECTRONICALLY IDENTIFYING THE DISPLACEMENT AND/OR POSITION OF AN OBJECT

(75) Inventors: Gerd Reime, Schömberg (DE); Peter Langer, Karlsruhe (DE); Michael Domokos, Kuernbach (DE)

(73) Assignee: Mechnlesm Systems GmbH (DE)

( * ) Notice: Subject to any disclaimer, the term of this patent is extended or adjusted under 35 U.S.C. 154(b) by 73 days.

(21) Appl. No.: 10/507,453

(22) PCT Filed: Mar. 11, 2003

(86) PCT No.: PCT/EP03/02452

§ 371 (c)(1),
(2), (4) Date: Sep. 13, 2004

(87) PCT Pub. No.: WO03/076870

PCT Pub. Date: Sep. 18, 2003

(65) Prior Publication Data

US 2005/0092900 A1    May 5, 2005

(30) Foreign Application Priority Data

Mar. 13, 2002   (DE) ................................ 102 11 307

(51) Int. Cl.
*G02B 6/00*   (2006.01)

(52) U.S. Cl. ......................................... 385/12; 385/94
(58) Field of Classification Search .................. 385/12, 385/128, 129; 250/221, 224
See application file for complete search history.

(56) References Cited

U.S. PATENT DOCUMENTS

| 4,092,640 A | 5/1978 | Satoh |
| 4,868,384 A | 9/1989 | Franken et al. |
| 2002/0020808 A1 | 2/2002 | Kado |
| 2003/0020004 A1* | 1/2003 | Reime ................. 250/214 SW |

FOREIGN PATENT DOCUMENTS

| DE | 0249746 A2 * | 12/1987 |
| EP | 0 706 648 | 9/1997 |
| FR | 2 693 859 | 1/1994 |
| WO | WO 01/54277 | 7/2001 |

OTHER PUBLICATIONS

International Search Report for International Application No. PCT/EP03/02452 dated Jan. 7, 2003.
English Abstract of DE19851505, 2000.
English Abstract of DE3306941, 1984.
English Abstract of FR2693859, 1994.

* cited by examiner

*Primary Examiner*—Jennifer Doan
(74) *Attorney, Agent, or Firm*—Cantor Colburn LLP

(57) ABSTRACT

The invention relates to a device and a method for optoelectronically identifying the displacement and/or position of an object. According to the method, a transmitter element emits light, which is received by at least one receiver element and the light emitted from the transmitter element is scattered by an object, wherein an optical guide is provided between the transmitter element and the receiver element. This aim of the invention is to fulfill the prerequisites for a key construction, which can be operated below a sealed surface. To achieve this, the optical guide includes light coupling means for coupling in the illumination that has been scattered by the object and previously emitted by the optical guide.

22 Claims, 4 Drawing Sheets

DEVICE AND METHOD FOR OPTOELECTRONICALLY IDENTIFYING THE DISPLACEMENT AND/OR POSITION OF AN OBJECT

REFERENCE TO RELATED APPLICATIONS

This application is a 371 of PCT/EP03/0245, filed on Mar. 11, 2003. The present application claims the priority of the German patent application 102 11 307.6 filed on 13 Mar. 2002 the disclosure of which is also hereby expressly included within the subject matter of the present application.

1. Field of the Invention

The invention relates to a device and to a method for optoelectronically detecting the movement and/or the position of an object.

2. State of the Art

Virtually every modern item of equipment possesses a key field for the operation thereof. This may extend from just a few keys up to the size of a PC keyboard. Key fields comprising 3×4 or 4×4 keys have become established as a standard size in the segment relating to the operation of automatic devices. These keyboards are often exposed externally to a high dirt load. The demands generally made on a keyboard are that it should always be ready for operation, be easy to operate and easy to clean. Furthermore, the questions of anti-vandalism and freedom from germs also play a role, especially in the case of publicly accessible automatic devices.

The keyboards marketed until now usually consist of individual mechanical switching elements. Hereby, an electrical contact is closed or opened by the pressure of the operator's finger. Keyboards of this type contain moving parts which are subject to mechanical wear.

As is derivable from U.S. Pat. No. 4,092,640 A1 for example, use is also made of individual switching elements in the form of keys which use the antenna effect of the human body.

However, the factor common to all of these keyboards is that they are subject to wear and incorporate crevices which are an impediment to effective cleaning. Membrane-type keyboards do of course have a sealed surface although this is mechanically fragile due to the materials used.

From FR 2 693 859 A1 which forms the basis for the preamble of claim 1, it is known to use an optical fibre which is employed as an optical guide. Light is emitted through an optical guide and reflected back by an object and is then detected again via another optical guide.

SUMMARY OF THE INVENTION

An exemplary embodiment of the invention is to create the prerequisites for the construction of a key which can be operated under a sealed surface.

For this purpose, an optical guide is used which is at least capable of coupling into the optical guide light that was previously emitted through the optical guide and then backscattered in a diffuse manner with arbitrary changes of angle by any object.

SHORT DESCRIPTION OF THE FIGURES

The invention is described in more detail hereinafter in exemplary manner with reference to the accompanying drawings. However, the exemplary embodiments are merely examples which are not intended to limit the inventive concept to a particular arrangement.

Figure 1:
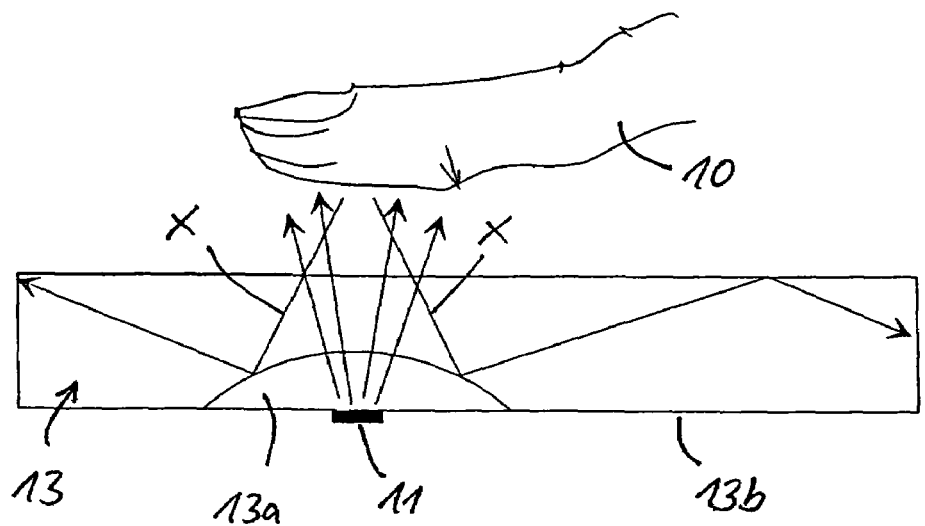
Figure 2:
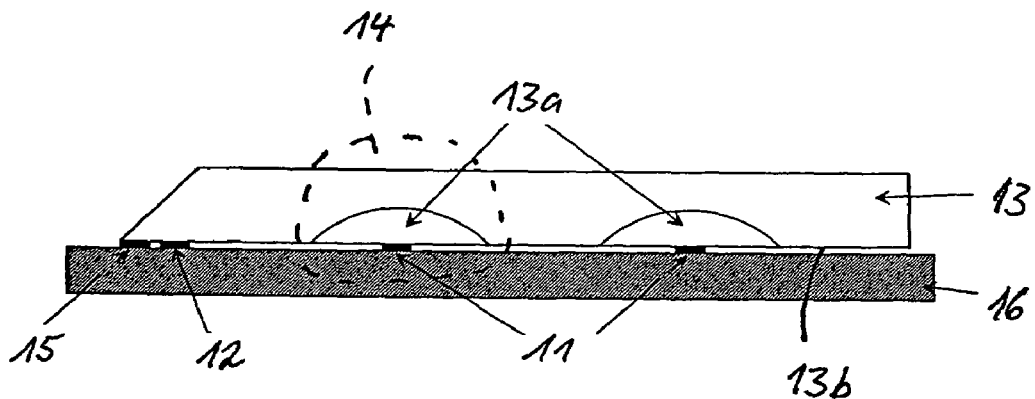
Figure 3:
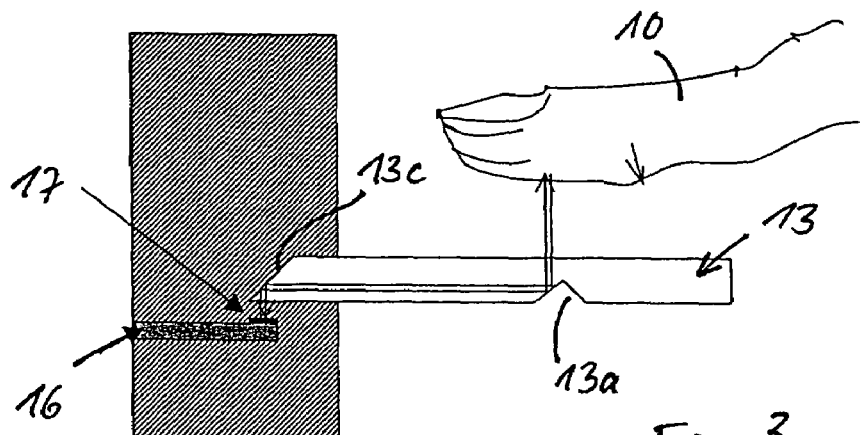
Figure 4:
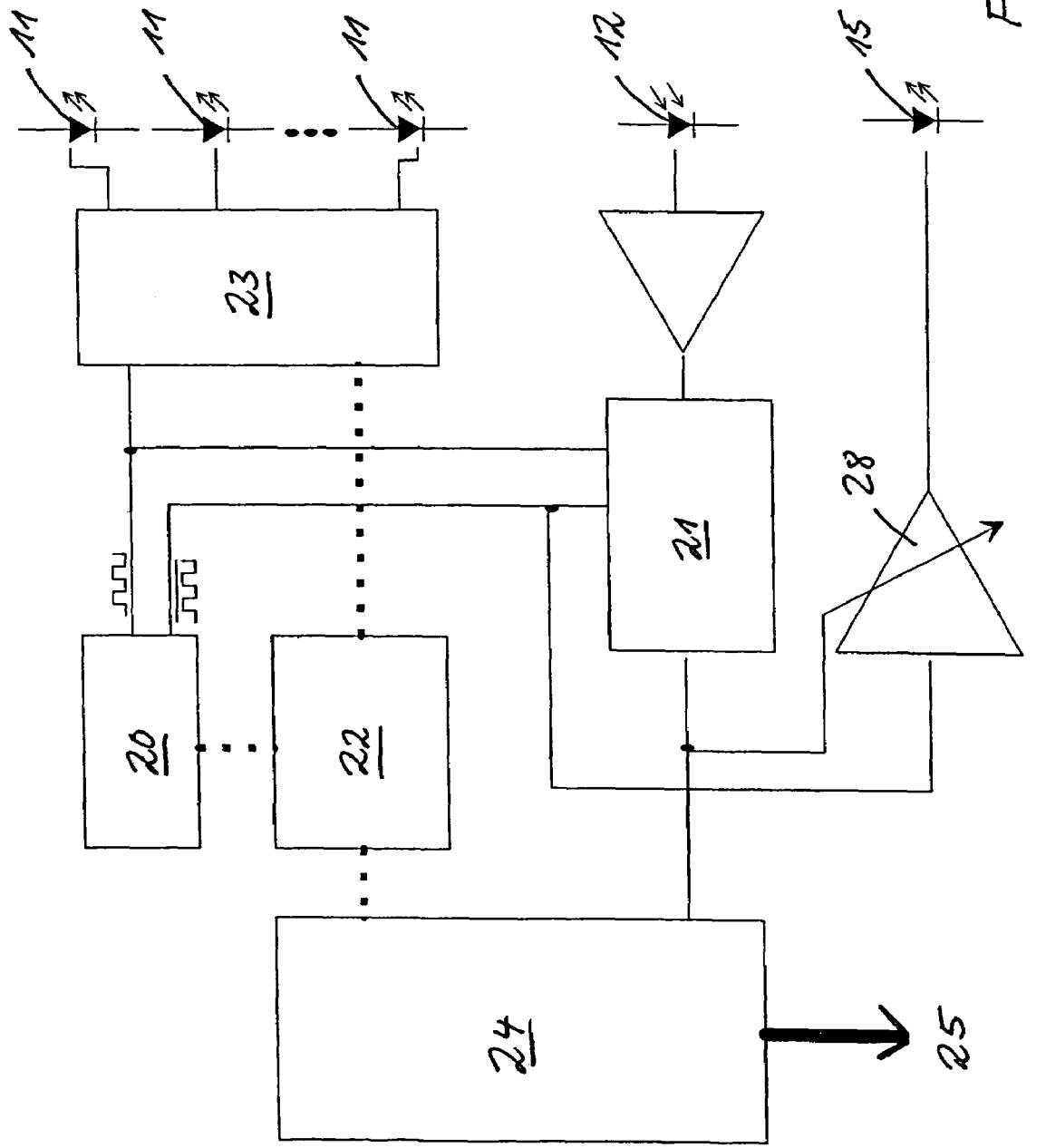
Figure 5:
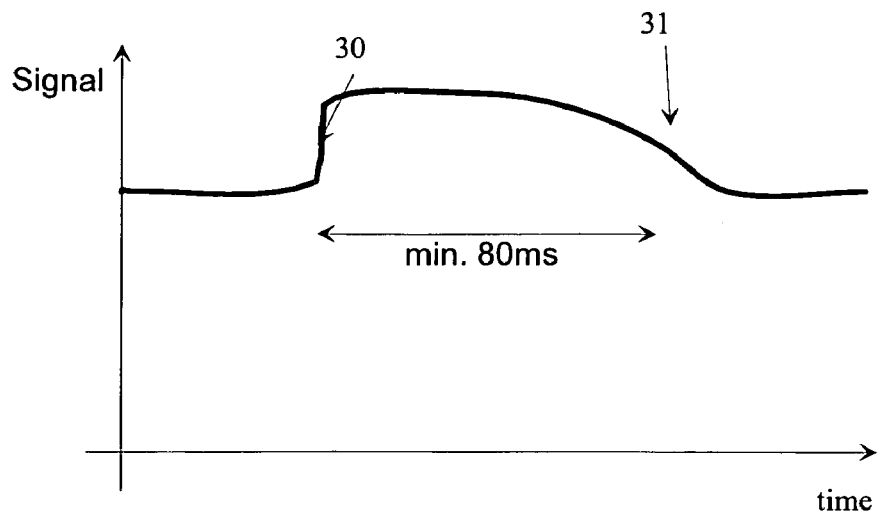
Figure 6:
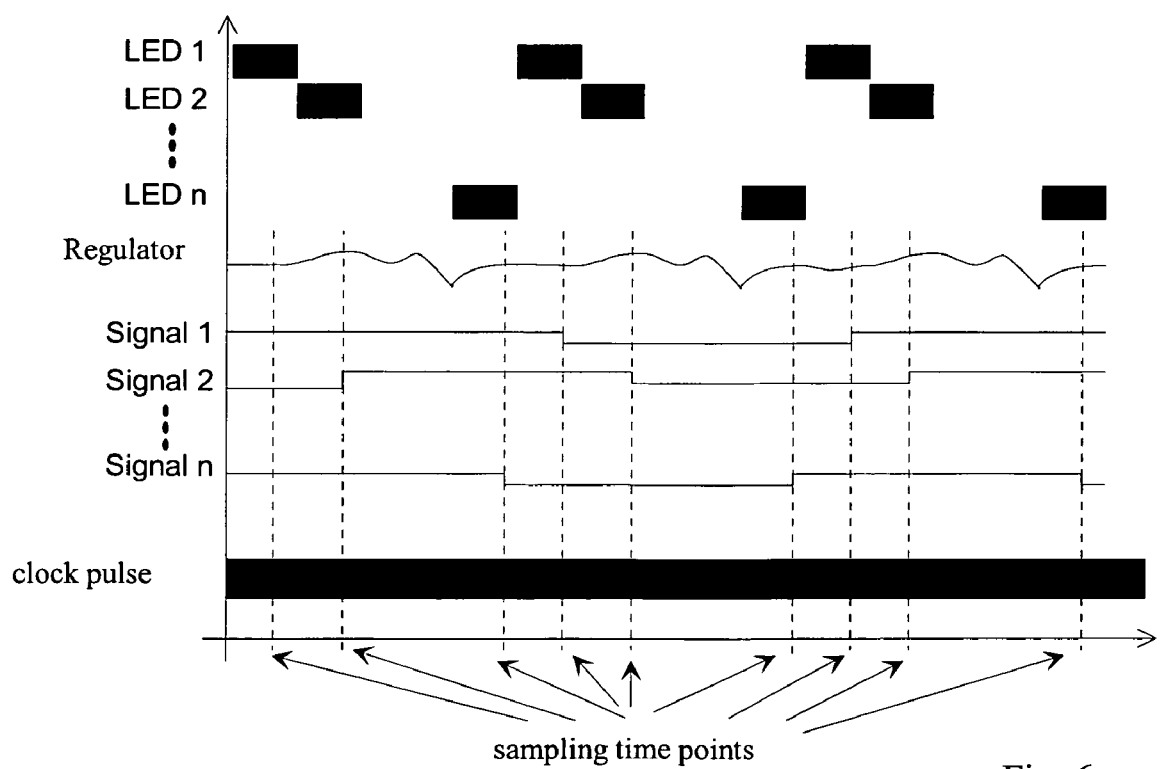
Figure 7:
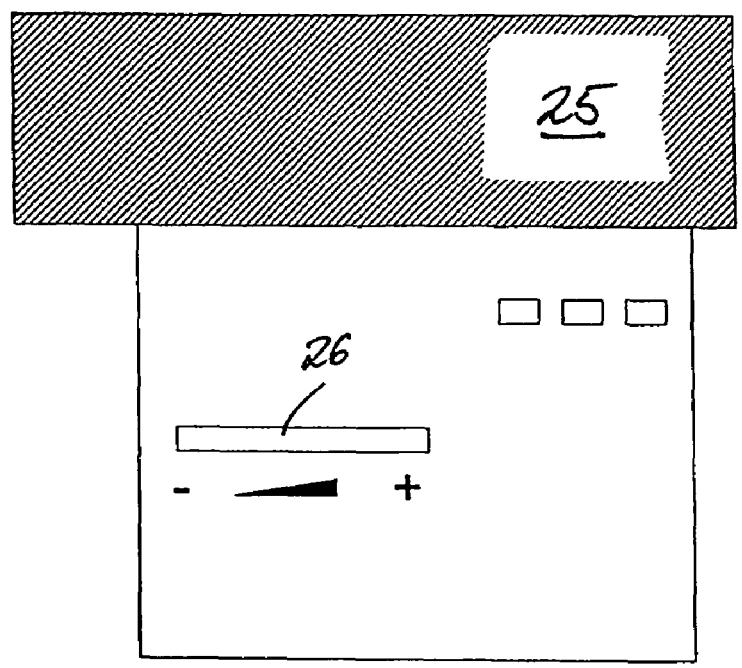
Figure 8:
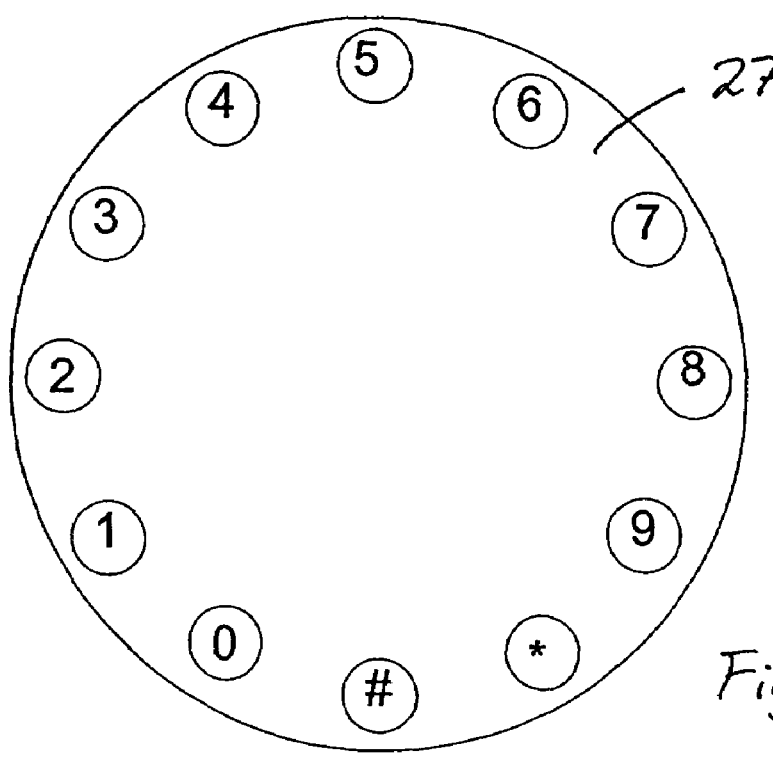

FIG. 1 shows a side view of an optical guide comprising light coupling means when being approached by an object, together with details of the path of the light rays, FIG. 2 the arrangement of an optical guide over a plurality of transmitting elements, FIG. 3 the side view of an optical guide wherein the optoelectronic components are arranged at the edge of the optical guide, FIG. 4 a block circuit diagram, FIG. 5 the waveform of the signal during the approach of an object, FIG. 6 the temporal sequence of the signal detection process, FIG. 7 a device incorporating a sliding control, FIG. 8 a dial-type keyboard.

DESCRIPTION OF PREFERRED EXEMPLARY EMBODIMENTS

The Figures depict a device for optoelectronically detecting the movement and/or the position of an object 10. For example, the approach of an object 10 in the form of a finger to a keyboard can be detected. The device comprises at least one transmitting element 11 for transmitting radiation in the form of light in a wavelength range extending from the infrared to the ultraviolet, and at least one receiving element 12 for receiving at least a portion of the radiation that was emitted by the transmitting element 11 and scattered by the object 10. Furthermore, an optical guide is arranged in the beam path between the transmitting element 11 and the receiving element 12.

This optical guide 13 itself comprises light coupling means for coupling in the radiation that was previously emitted through the optical guide 13 and scattered in a diffuse manner by the object 10, said radiation having been subjected to a change of angle at the object. The radiation is coupled-in by the light coupling means 13a in accordance with FIG. 1 by virtue of the light coupling means being formed in the optical guide in such a manner that rays incident at above a certain angle obliquely relative to the optical guide are totally reflected and then forwarded through the optical guide. Thus, light incident transversely relative to the optical guide is deflected through almost a right angle in dependence on the optical properties of the optical guide. The light coupling means can also be used for coupling-out the light emitted therein.

The transmitting element 11 can radiate transversely through the optical guide as depicted in FIG. 1 so that the radiation does not initially enter the optical guide since it is not subjected to the total reflection necessary for this purpose. However, if the light is then backscattered by the object 10, the backscattered light is totally reflected in the optical guide at the light coupling means 13a and subsequently "imprisoned" in the optical guide. In other words, the reflective properties of the optical guide 13 and the arrangement of the transmitting element with respect to the optical guide are such that the transmitting element 11 can emit the light substantially through the optical guide. If, however, the light is diffusely backscattered by the object 10 even with just a small change of angle, a total reflection of the "trapped" ray of light becomes possible in the exemplary embodiment so that the light can then be forwarded within the optical guide. Hereby, the transmitting element is usually located on the side 13b of the optical guide which is remote from the moving and/or approaching object 10. Consequently, the optical guide itself could, if necessary, also form the sealed surface under which the keyboard that is to be operated is protected. By choosing this surface, there are no crevices and the material can be used in areas subjected to considerable environmental effects of a mechanical or chemical nature.

The optical guide 13 may also comprise a plurality of light coupling means 13*a*. Preferably, the light coupling means 13*a* are spatially associated with a respective transmitting element 11 so that the transmitting elements 11 can be arranged in the form of a keyboard. The respectively associated light coupling means 13*a*, which may preferably be of curved construction or in the form of a circular segment, is then located on each key 14—as indicated by the dashed lines in FIG. 2. It is preferred that a transmitting element 11 in the form of a light emitting diode be used for each key. With the aid of a suitable optical system, all of the transmitting elements 11 are effective on the receiving element 12 which is illuminated simultaneously by an additional compensating LED 15. The light coupling means 13*a* can be produced by milling a slot into the optical guide 13 for example. Since this milled slot i.e. the light coupling means 13*a* only penetrates just partially into the optical guide 13, the light reflected in the remainder of the optical guide can reach the receiving element 12 from every key position. Preferably, the light coupling means 13*a* only penetrates by approximately 50% into the optical guide.

In principle, the transmitting elements and receiving elements could also be inverted. Thus, for example, a plurality of receiving elements could be associated with the keys, e.g. one receiving element can be associated with each key, whilst preferably at least two transmitting elements are arranged at a suitable position. When arranging the transmitting elements, it need only be ensured that there is a light path to the receiving elements.

The suitability of the arrangement as a keyboard is strengthened by the fact that a device for compensating extraneous light is available, for example, a device such as is known from EP 0 706 648 B1, the subject matter of which is hereby also expressly incorporated in the subject matter of the present application.

Therein, for the purpose of detecting water drops on a sheet of glass, there are provided two measuring sections between the transmitting element and the receiving element. While the transmitting element emits the radiation, the receiving element detects the back radiation that has been reflected from the surfaces or the objects. The two measuring sections are operated in time-divided manner under the control of a clock pulse generator 20 as is also illustrated in FIG. 4. In the exemplary embodiment depicted here, the clock pulses are supplied to a multiplexer 23 in order to control further transmitting elements 11, in particular, those of a keyboard. The detection signals derived by the receiving element 12 are filtered and divided up again in a synchronous demodulator 21 under the control of the clock pulse generator 20 into signals that are associable with the individual measuring sections. The information signal derived from a comparison of the measuring sections is supplied to an evaluating unit 24 which switches on an equipment 25 in dependence thereon.

If there is uniform reflection in both measuring sections, then the information signal is zero. The information signal is supplied to a signal centring stage. Depending upon whether a regulating voltage is or is not present at the output thereof, the quantity of radiation being radiated into the measuring sections is then regulated by this regulating voltage so that counter-regulation of the detection signal is effected in dependence on a time constant. In the exemplary embodiment, this is effected by the compensating LED 15 which is driven by the oppositely phased clock pulse and regulated by the regulator 28 on the basis of the information signal. Consequently, it is possible to detect dynamic changes, and thus too the approach, movement and/or position of an object transversely relative to the optical guide whereby extraneous light is reliably compensated at the same time.

As in the exemplary embodiments, the compensating LED 15 may be in the form of just a single light emitting diode which is appropriately regulated and also maintained in continuous operation when necessary, whilst the intensity of the radiation emitted thereby is controlled by the clock pulses in dependence on the compensation required for compensating the currently clocked transmitting element 11. It is advantageous that the compensating LED in FIG. 2 can also be operated in the direct vicinity of a receiving element 12 since even an optical path of virtually zero is sufficient for the compensation process. To this extent, only the transmitting elements 11 need be associated with the "keys" 14, whilst the receiving element 12 and the compensating LED 15 could also be spaced therefrom in this embodiment. One of the transmitting elements 11 themselves could also be used as the compensating LED 15.

Consequently, the compensating LED is preferably arranged at the edge of the optical guide 13. In accordance with FIG. 3, the compensating LED 15 can be arranged e.g. at an inclined edge 13*c* of the optical guide. Then, in accordance with FIG. 3, it is possible to arrange for the surface of the printed circuit board 16 not to be located entirely under the optical guide. In consequence, the printed circuit board incorporating the optoelectronic components 17 can also be provided merely in the vicinity of the inclined or bevelled edge 13*c* of the optical guide, whereas the optical guide 13 itself projects outwardly in the form of a free keyboard. However, it is not just the receiving element 12 and the compensating element 15 that can be arranged near the edge, but, in the case of an embodiment in accordance with FIG. 3, the transmitting elements 11 themselves can also be spaced from the actual input area which is located in the vicinity of the light coupling elements 13*a*. Thus, in an embodiment of this type, the optical guide can be of e.g. planar construction and hence be located on a keyboard, without interference thereby arising from optoelectronic or other components because the optical guide is separate therefrom. This makes it possible for all of the optoelectronic components to be mounted on a circuit board and to lay out the optical guide in a planar manner. However, the possibility also exists of coupling-out the light in spot-like or strip-like manner by suitable shaping of the light coupling elements and then coupling the light reflected by a finger back in again so that push button or sliding controls can be implemented on a free-standing board.

In the exemplary embodiment, the optical guide is constructed in such a way that it comprises light coupling means in the form of e.g. milled slots on the side 13*b* thereof. In principle however, it is also possible to form the relevant light coupling means in the optical guide by means of an e.g. casting process if suitable optical boundary surfaces are present. If the boundary surfaces are constructed carefully, optical guides can then be produced which are not likely to be statically weakened by the milled slots.

The transmitting elements are fed sequentially with a clock pulse. The compensating LED 15 receives the inverse clock pulse in an appropriately regulated manner. In accordance with EP 0 706 648 B1, the intensity of the compensating LED 15 is regulated in such a way that the transmitting element 11 and the compensating LED 15 produce the same signal amplitude at the receiver 12. This happens cyclically for all of the transmitting elements 11, for a number of clock cycles in each case. The synchronous demodulator and the regulator 21 supply a signal in time sequential manner for each of the possible control loops. This control signal has a waveform such as is shown in FIG. 5 for example when an object 10 approaches. A corresponding optical key which works in this manner is known from WO 01/54276 A1. The change caused by the movement of the finger is evaluated by the method known from WO 01/54277 A1.

In principle, the compensating LED could also emit unregulated light of e.g. constant intensity, whilst the transmitting elements are regulated individually. In end effect, nothing changes thereby.

Due to the switching of the transmitting elements 11, one receives the signal shown in FIG. 5 in the form of sampling values which are clocked at intervals of a few milliseconds. When using a sampling rate of e.g. 200 kHz, the individual transmitting elements 11 are controlled in time sequential manner and interrogated as soon as they attain the steady state. This then results in a pattern in accordance with FIG. 6, from which, for example, a waveform in accordance with FIG. 5 can be derived.

The signal in accordance with FIG. 5 differs from the signal waveforms that are produced by movement in the proximity of the input field or by means of a wiping action by virtue of the jump-like alteration of the signal when the finger impacts the surface of the key (position 30), a stable level for the period of time for which the finger remains thereon which is at least 80 milliseconds, as well as by the drop in the signal when the finger is removed in accordance with position 31. Other alterations of the signal are evaluated as being an approaching action and these can be used for activating a lighting arrangement for the key or for activating the attached equipment. It is likewise conceivable for an optical or acoustic feedback signal to be given when contact with a key has been detected.

Thus, in this method, radiation in the optical wavelength range is emitted, the light passes through an optical guide 13 up to the object 10 and is scattered back by the object. The backscattered quantity of light is coupled at least partially into an optical guide 13 and received by the receiving element 12 in the form of an input signal. The movement and/or the position of the object 10 is determined from this signal in an evaluating unit. Thereby, the coupling-in process is effected by the light coupling means 13a of the optical guide 13 itself, preferably transversely to the optical guide.

Apart from the employment as a classical keyboard, it is equally possible for the individual keys to be arranged smaller as points of a matrix for example. If this matrix possesses at least 5×7 points, then every alphanumeric symbol can be entered thereby. A standard display element can be used here as a transmitting array. It is useful hereby, if the detected keys are illuminated for a long period in order to provide the user with feedback and thus simulate a writing process. As has already been explained, the control of the e.g. LEDs used as transmitting elements takes place in a time sequential manner. Consequently, the illuminating process can be effected in the pauses between interrogations, especially if, as is preferable, the transmitting frequency is not perceptible to the human eye. The detected signals can thus be used as input for a writing recognition process. The constant light produced by the continuous illumination does not interfere with the key evaluation process since this only works with modulated light.

Further arrangements of the individual elements result, for example, in sliding regulators, rotary regulators or control matrices such as e.g. the sliding control illustrated in FIG. 7. A sliding control of this type could be shaped as in the side view in accordance with FIG. 3, insofar as the light coupling means 13a extends over a longer region transverse to the plane of the Figure. In a circular arrangement in accordance with FIG. 8 consisting of e.g. 12 keys, a keyboard can also be provided which is similar to a rotary dial-type keyboard 27.

Since scattered light from the transmitting elements 11 can also reach the receiving element 12 and a light emitting diode can also function as a receiver, it is not absolutely necessary for a separate compensating LED 15 and a receiver to be used. Other key LEDs could also be used as a compensating LED or a receiver instead.

It is to be understood that this description can be subjected to various modifications, alterations and adaptations as would fall within the range of equivalents to the appended claims.

The invention claimed is:

1. A device for optoelectronically detecting movement and/or position of an object comprising at least one transmitting element for emitting radiation in the optical wavelength range and at least one receiving element for receiving at least a part of the radiation emitted by the transmitting element and reflected back by the object and also comprising an optical guide arranged in the beam path between the transmitting element and the receiving element,
   wherein the optical guide comprises at least one light coupling element for at least one of:
   coupling-in the radiation previously radiated through the optical guide and diffusely scattered at the object transversely to a longitudinal extent of the optical guide, and
   coupling-out radiation radiated to the optical guide by the transmitting element transversely to the longitudinal extent of the optical guide,
   wherein the at least one transmitting element and/or the at least one receiving element are arranged at the edge of the optical guide spaced from the light coupling element.

2. A device in accordance with claim 1, wherein the radiation radiated through the optical guide by the transmitting element is radiated transversely through the optical guide from the side opposite the object.

3. A device in accordance with claim 1, wherein radiation emitted along the optical guide by the transmitting element is at least partially coupled-out of the optical guide by the at least one light coupling element before it is scattered by the object.

4. A device in accordance with claim 1, wherein the at least one light coupling element is a forming at the side of the optical guide facing away from the object transversely approaching the optical guide.

5. A device in accordance with claim 1, wherein the optical guide comprises a plurality of light coupling elements which are spatially associated with a respective transmitting element.

6. A device in accordance with claim 1, wherein the transmitting elements are arranged in the form of a keyboard and in that a curved or circular-segment-shaped light coupling element is associated with each key.

7. A device in accordance with claim 1, wherein the at least one light coupling element only partially penetrate into the optical guide.

8. A device in accordance with claim 1, wherein a compensating device for compensating for extraneous light comprises a clock pulse generator for controlling the multiplexing of a plurality of transmitting elements which emit radiation into a plurality of radiation measuring sections, and also a synchronous demodulator which is controlled by the clock pulse generator for associating the detected signal in the form of a measured value with the individual measuring sections, and in that, in dependence on the detected values, at least one compensating LED emits light for compensating the extraneous light.

9. A device in accordance with claim 8, wherein the at least one compensating LED is arranged at the edge of the optical guide.

10. A device in accordance with claim 8, wherein the at least one compensating LED is formed by one of the transmitting elements.

11. A device in accordance with claim 1, wherein a plurality of light coupling elements is arranged in the form of a matrix.

12. A device in accordance with claim 1, wherein a plurality of light coupling elements is arranged in the form of a circle.

13. A device in accordance with claim 1, wherein signals derived by the at least one receiving element are used as input for a writing recognition system.

14. A device in accordance with claim 1, wherein the at least one transmitting element remains illuminated after a key associated therewith is actuated.

15. A method for optoelectronically detecting movement and/or position of an object comprising the steps:
   emitting radiation in an optical wavelength range,
   emitting the radiation through an optical guide up to the object,
   reflecting at least a part of the radiation from the object and coupling the reflected radiation back into the optical guide,
   receiving the reflected radiation and forming an input signal,
   evaluating the input signal for determining the movement and/or the position of the object,
   wherein at least one of:
   a diffusely backscattered radiation is coupled into the optical guide by at least one light coupling element of the optical guide itself transversely relative to a longitudinal extent of the optical guide, and
   a radiation emitted through the optical guide by at least one transmitting element is radiated by at least one light coupling element of the optical guide itself transversely to the longitudinal extent of the optical guide.

16. A method in accordance with claim 15, wherein the radiation is light.

17. A method in accordance with claim 15, wherein a radiation emitted through the optical guide by the at least one transmitting element is radiated transversely through the optical guide from a side opposite the object before it is backscattered by the object.

18. A method in accordance with 15, wherein the radiation emitted along the optical guide by the at least one transmitting element is at least partially coupled-out of the optical guide by the light coupling element before it is scattered by the object.

19. A method in accordance with claim 15, wherein a plurality of transmitting elements operating in a multiplex mode radiate light, and in that derived input signals are divided into light components stemming from the plurality of transmitting elements, and in that, in dependence on the derived input signals, at least one compensating LED is controlled for compensating extraneous light.

20. A method in accordance with claim 19, wherein at least one of the transmitting elements is used as the compensating LED.

21. A method in accordance with claim 15, wherein signals derived by at least one receiving element are used as input for a writing recognition system.

22. A method in accordance with claim 15, wherein at least one transmitting element remains illuminated after a key associated therewith is actuated.

* * * * *